(12) United States Patent
Tsai et al.

(10) Patent No.: US 11,300,611 B2
(45) Date of Patent: Apr. 12, 2022

(54) IMAGE TEST SYSTEM AND TEST ASSEMBLY THEREOF

(71) Applicant: King Yuan Electronics Co., Ltd., Hsinchu (TW)

(72) Inventors: Pin-Yan Tsai, Hsinchu (TW); Po-Kuan Sung, Hsinchu (TW); Kuang-Che Cheng, Hsinchu (TW); Hung-Chan Lin, Hsinchu (TW)

(73) Assignee: KING YUAN ELECTRONICS CO, LTD., Hsinchu (TW)

( * ) Notice: Subject to any disclaimer, the term of this patent is extended or adjusted under 35 U.S.C. 154(b) by 114 days.

(21) Appl. No.: 16/826,334

(22) Filed: Mar. 23, 2020

(65) Prior Publication Data

US 2021/0132146 A1   May 6, 2021

(30) Foreign Application Priority Data

Nov. 5, 2019   (TW) ................. 108140118

(51) Int. Cl.
*G01R 31/28* (2006.01)
*G01R 31/311* (2006.01)

(52) U.S. Cl.
CPC ........ *G01R 31/311* (2013.01); *G01R 31/2829* (2013.01)

(58) Field of Classification Search
CPC .. G01R 31/28; G01R 31/2829; G01R 31/311; G01R 1/073; G01R 31/2844; H01L 22/12; H01L 22/24
USPC ................................................ 324/754.07
See application file for complete search history.

(56) References Cited

U.S. PATENT DOCUMENTS

| 2006/0170435 A1* | 8/2006 | Granicher .......... G01R 1/07385 324/754.07 |
| 2017/0019186 A1* | 1/2017 | Wiley .................. H04B 10/801 |

FOREIGN PATENT DOCUMENTS

| JP | 2000243803 A | * | 9/2000 | ............. G01R 31/26 |
| JP | 2000243803 A |   | 9/2000 | |
| TW | 201447322 A |   | 12/2014 | |
| TW | 201530162 A |   | 8/2015 | |
| TW | M558360 U |   | 4/2018 | |

OTHER PUBLICATIONS

Espacenet English translation of Kameyama et al. JP 2000/243803 A (Year: 2000).*

* cited by examiner

*Primary Examiner* — Jermele M Hollington
*Assistant Examiner* — Courtney G McDonnough
(74) *Attorney, Agent, or Firm* — Bacon & Thomas, PLLC

(57) ABSTRACT

An image test system includes a test assembly and an image capture card. The test assembly is provided for capturing test signals from test objects, and incudes a first transmission interface, a second transmission interface, and an interface conversion circuit. The interface conversion circuit is connected with the first transmission interface, and converts signal transmission forms of the test signals. The second transmission interface is connected with the interface conversion circuit. Besides, the image capture card is provided for connecting with the second transmission interface, and captures image data from the test signals.

18 Claims, 8 Drawing Sheets

Fuzzy Table 50

| New \ Last | N2 | N1 | Z | P1 | P2 |
|---|---|---|---|---|---|
| P2 | Z | N1 | Z | P1 | P2 |
| P1 | N1 | P1 | P1 | P1 | P2 |
| Z | N1 | Z | P1 | Z | P1 |
| N1 | N1 | Z | Z | N1 | P1 |
| N2 | N2 | N1 | N1 | N1 | Z |

FIG. 4

IMAGE TEST SYSTEM AND TEST ASSEMBLY THEREOF

BACKGROUND OF THE INVENTION

1. Field of the Invention

The present invention relates to a test system and a test assembly thereof, and more particularly, to an image test system and a test assembly thereof.

2. Description of Related Art

Normally, an image capture card, which is incorporated with the test device of a semiconductor device, is provided with a logic processing unit, where image signals captured from an image-capture component (such as a camera) can be pre-decoded by the logic processing unit. Thereafter, the decoded image signals will be transmitted to a back-end image processing device for processing. As such, image testing currently becomes an important part among testing items for semiconductor devices. In order to meet the demand of ultrahigh image quality, transmission of image signals has been gradually proceeded with a form of C-typed physical layer (hereinafter referred to as "C-PHY") signals, so as to replace the previous form of D-typed physical layer (hereinafter referred to as "D-PHY") signals. Currently D-PHY signals are transmitted with a measure of differential transmission, and that clock data are provided for a test system to perform a time sequence correction of image data. In contrast, the C-PHY signals are not transmitted through the differential measure, and as a result, the C-PRY signals are suitable only for a shorter signal transmission route (in contrast to the D-PHY signals). In addition, the C-PHY signals are not provided with clock data for correction.

Presently under the framework of an image test system, the image capture card can capture C-PHY signals through a test assembly (for example a prober); and then through a data conversion unit, the C-PHY signals can be converted into signals having forms able to be read by the logic processing unit in the image capture card. However, under the limitation of substrate layout, a longer data transmission route exists now and then between the prober and the data conversion unit, resulting in more energy consumption for the C-PRY signals due to the longer data transmission route, Besides, the problem of jitter often occurs because of signal clock offset, and this will adversely affect accuracy of the test system.

Given the above, in an attempt to solve the problem, as mentioned above, research and experiments for "Image Test System and Test Assembly Thereof" have been undertaken, eventually resulting in accomplishment of the present invention.

SUMMARY OF THE INVENTION

An object of the present invention is to provide an image test system, comprising a test assembly and an image capture card. The test assembly is provided for capturing test signals from test objects, and includes a first transmission interface, a second transmission interface, and an interface conversion circuit. The first transmission interface is provided for receiving the test signals. The interface conversion circuit is provided for connecting with the first transmission interface, and for converting signal transmission forms of the test signals. The second transmission interface is connected with the interface conversion circuit, wherein the first transmission interface and the second transmission interface correspond to different signal transmission forms. Besides, the image capture card is provided for connecting with the second transmission interface, and captures image data from the test signals.

According to the present invention, the first transmission interface relates to a Mobile Industry Processor Interface C-PRY Interface (MIPI C-PHY interface), and includes a 3-wires serial signal channel.

Further, according to the present invention, the second transmission interface relates to a high-speed logic interface, and includes three pairs of high-speed logic signal channels. In addition, the second transmission interface includes one of the following types: low voltage differential signaling (LVDS); current mode logic (CML); positive emitter coupled logic (PECL); and negative emitter coupled logic (NECL).

Still further, according to the present invention, the test assembly relates to a probe card, and includes a probe card sub-board, such that the interface conversion circuit is arranged on the probe card sub-board. In addition, the image capture card is integrated on the probe card sub-board; and that a transmission route distance between the probe and the probe card sub-board is smaller than or equal to 10 cm.

According to the present invention, the image capture card includes a logic procession unit, and that the logic procession unit includes a fuzzy controller for performing a clock data recovering procedure to the image data. Besides, the logic procession unit includes a memory unit for storing a fuzzy control look-up table, such that the fuzzy controller can perform the clock data recovering procedure based on the fuzzy control look-up table. Further, the fuzzy control look-up table includes last tune clock offset data, present time clock offset data, and recovering data, wherein each recovering data corresponds to a last time clock offset data, and to a present time clock offset data.

Another object of the present invention is to provide a test assembly, which is arranged in the image test system, for capturing tested signals of a test object, and that the test assembly comprises a first transmission interface, an interface conversion circuit, and a second transmission interface. The first transmission interface is provided for receiving the test signals. The interface conversion circuit is provided for connecting with the first transmission interface, and to convert signal transmission forms of the test signals. The second transmission interface is provided for connecting with the interface conversion circuit, wherein the first transmission interface and the second transmission interface correspond to different signal transmission forms.

According to the another object of the present invention, the first transmission interface relates to a Mobile Industry Processor Interface C-PHY Interface (MIDI C-PHY interface), and includes a 3-wires serial signal channel.

Further, according to the another object of the present invention, the second transmission interface relates to a high-speed logic interface, and includes three pairs of high-speed logic signal channels. In addition, the second transmission interface includes one of the following types: low voltage differential signaling (LVDS); current mode logic (CML); positive emitter coupled logic (PECL); and negative emitter coupled logic (NECL).

Still further, according to the another object of the present invention, the test assembly relates to a probe card, and includes a probe card sub-board, such that the interface conversion circuit is arranged on the probe card sub-board. In addition, the image test system comprises an image capture card for connecting with the second transmission interface, so as to obtain image data from the test signals. The image capture card is integrated on the probe card sub-board, and that the probe card includes a plurality of probes, where a signal transmission route between the probes and the probe card sub-board is smaller than or equal to 10 cm.

According to the another object of the present invention, the image test system comprises an image capture card for connecting with the second transmission interface, so as to obtain image data from the test signals. The image capture card includes a logic procession unit, and that the logic procession unit includes a fuzzy controller for performing a clock data recovering procedure to the image data, Besides, the logic procession unit includes a memory unit for storing a fuzzy control look-up table, such that the fuzzy controller can perform the clock data recovering procedure based on the fuzzy control look-up table. Further, the fuzzy control look-up table includes last time clock offset data, present time clock offset data, and recovering data, wherein each recovering data corresponds to a last time clock offset data, and to a present time clock offset data.

Other objects, advantages, and novel features of the invention will become more apparent from the following detailed description when taken in conjunction with the accompanying drawings.

BRIEF DESCRIPTION OF THE DRAWINGS

FIG. 4 is a fuzzy control look-up table according to the present invention;

DETAILED DESCRIPTION OF THE PREFERRED EMBODIMENT

The following are descriptions, on several embodiments, about aspects of implementation and of operational principle regarding the image test system and the image capture card according to the present invention. The present invention falls within the technical field known to those of common knowledge, and that features and effectiveness of the present invention can be comprehended through the embodiments of the present invention, and that based on the sprit of the present invention, the present invention can be combined, modified, replaced or converted.

According to the present invention, the term "connection" refers to, but not limited to, an aspect of direct connection or indirect connection. Further, the term "when . . . " or "at the moment of . . . " refers to, but not limited to, the present, before, or after.

Further, according to the present invention, the ordinals, such as "first," "second," and others, are used to modify components, and that the ordinals per se do not mean or represent that the components, as claimed, bear any ordinals beforehand. Nor the ordinals represent a sequence from one component to another; or a sequence in manufacturing methods. Rather, the ordinals are used only for the purpose of differentiating a denominated component from another that both are denominated identically.

Figure 1:
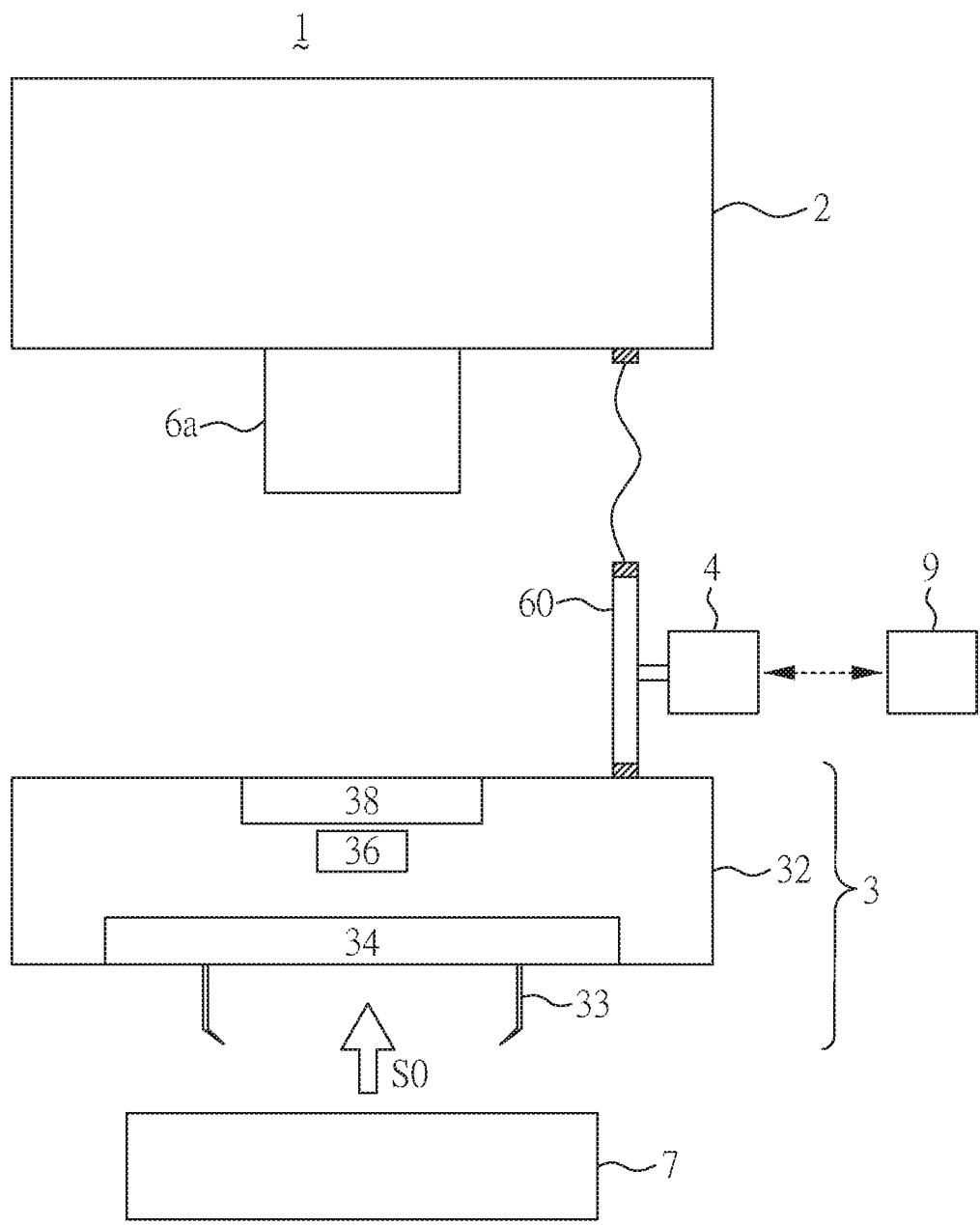
FIG. 1 is a schematic view illustrating the framework of an image test system according to the present invention.

Still further, referring to FIG. 1, a schematic view illustrating the framework of an image test system according to the present invention, the image test system 1 comprises a test head 2, a test assembly 3, and an image capture card 4. The test assembly 3 is provided for contacting with a test object 7, where the test object 7 may be a wafer or other semiconductor components required to be processed with an electric test. The test head 2 can provide test procedures of the electric test to the test assembly 3. The test assembly 3 is provided for capturing test signals S0 from the test object 7. The image capture card 4 is provided for obtaining image data from the test signals S0. For example, the test object 7 can be an image sensor, and that the image capture card 4 can obtain, from the test signals S0, image data photographed by the test object 7, where the image data are converted into data formats adapted for a rear-end image process unit 9 (such as an external computer). Further, suppose the test object 7 relates to the processing chip of a display, then the image capture card 4 can obtain, from the test signals S0, image data played by the display presently, and convert the image data into data formats adapted for the rear-end image process unit 9 (such as a computer processor). However, these examples are proposed only for the purpose of exemplification rather than of limitation.

According to the present invention, the test head 2 can plug in interface cards which are essential for various test procedures, such as, but not limited to, pin electronics cards (PE cards), device power supply cards (DPS cards), sequence test cards (SEQ cards), and so forth. The test assembly 3 can be a prober, and includes a probe card 32; or alternatively, the test assembly 3 can be the probe card 32 itself, though not intended to be so limited. The probe card 32 may be provided with a plurality of probes 33, where the probes 33 can contact pins of the test object 7, such that the test head 2 can perform electric tests to the test object 7. Further, the image test system 1 can also comprise a light source supply 6a, where the light source supply 6a may relate, but not limited to, a tube-like light source supply arranged on the test head 2. According to the present invention, the light source supply 6a focuses the light source on the test object 7 (for example, integrated circuits of image sensors are provided on wafers), for testing the image sensor of the test object 7 as to what the actual range can be detected, so as to proceed with an overall image test. The probe card 32 can capture a test signal from the image sensor of the test object 7, wherein the test signal relates to a C-PHY signal. In addition, according to the present invention, the image capture card 4 can be an image capture card of the Mobile Industry Processor interface (MIPI), and can be connected with the probe card 32 through a first bridge board 60, though it is not intended to be so limited.

Further, one of the features of the present invention lies in an improvement of the test assembly 3, and preferably, the test assembly 3 includes a first transmission interface 34, an interface conversion circuit 36, and a second transmission interface 38. The first transmission interface 34 can receive the test signals S0 captured by the probe card 32. The interface conversion circuit 36 is connected with the first transmission interface 34, and the second transmission interface 38 with the interface conversion circuit 36. Besides, the image capture card 4 can be connected with the second transmission interface 38, and acquires the test signals S0 from the second transmission interface 38. The first transmission interface 34 and the second transmission interface 38 correspond to different signal transmission forms, and that the interface conversion circuit 36 can be provided for converting the signal transmission forms of the test signals S0.

Figure 2:
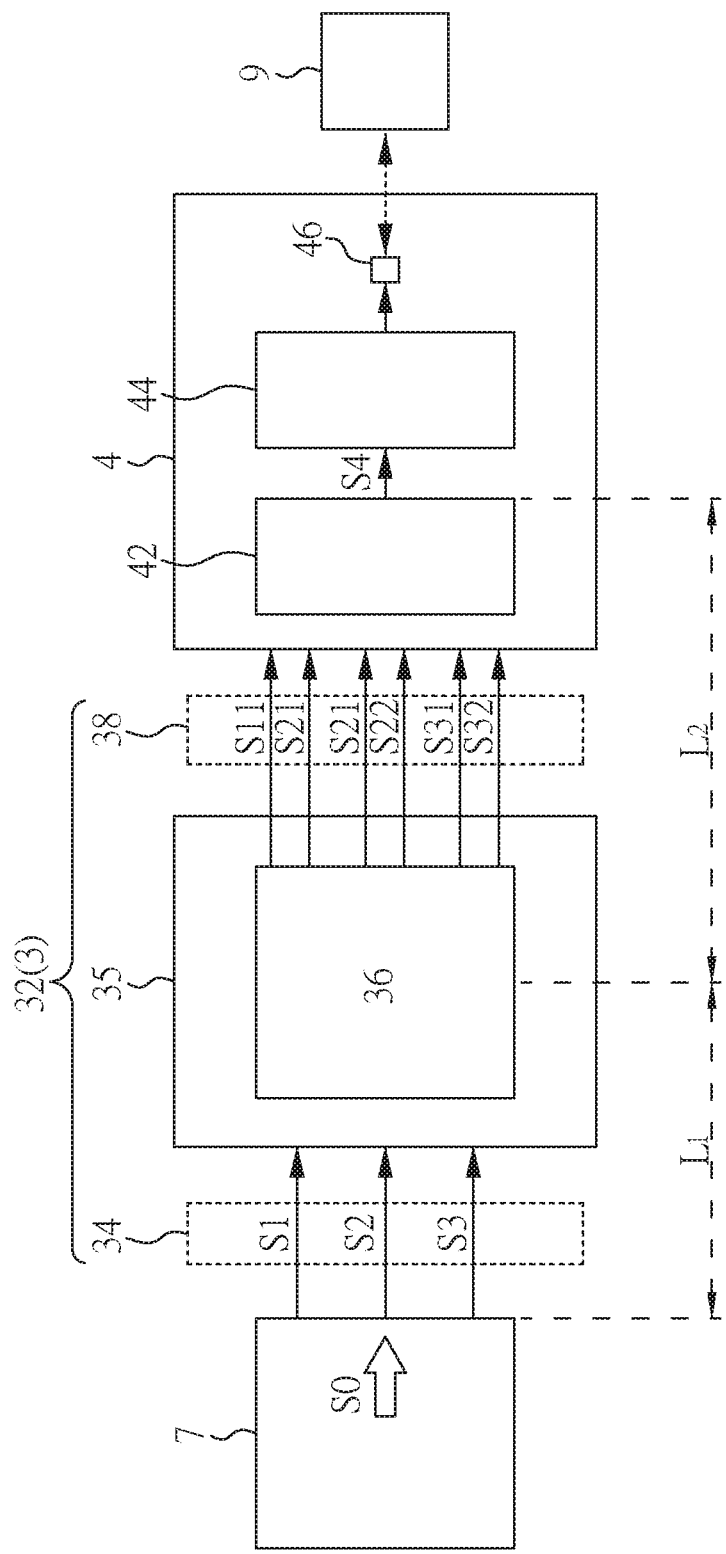
FIG. 2 is a schematic view illustrating in detail the framework of a test assembly and an image capture card according to a first embodiment of the present invention.

Now a reference is made to FIG. 2, a schematic view illustrating in detail a framework of the test assembly 3 and the image capture card 4 according to a first embodiment of the present invention. As shown, the first transmission interface 34 can obtain the test signals S0, and transmit the same to the interface conversion circuit 36, wherein the test signals S0 are transmitted in a first signal transmission form. The interface conversion circuit 36 can convert the test signals S0 from the first signal transmission form into a second signal transmission form, and transmit the test signals S0 to the second transmission interface 38. In other words, the interface conversion circuit 36 can convert the signal transmission forms of the test signals S0 from corresponding to the first transmission interface 34 into corresponding to the second transmission interface 38. The second transmission interface 38 can transmit the test signals S0 of the second signal transmission form to the image capture card 4. The image capture card 4 includes a data conversion unit 42, a logic procession unit 44, and a transmission unit 46, wherein the data conversion unit 42 can convert the test signals S0 of the second signal transmission form into a data format readable to the logic procession unit 44, where the logic procession unit 44 can acquire image data from the test signals S0. The image data can be transmitted, through the transmission unit 46, to the rear-end image process unit 9 (such as an external computer). According to the present invention, the transmission unit 46 may relate, but not limited, to a fiber interface.

It should be noted that, according to the present invention, the first transmission interface 34 relates to a Mobile Industry Processor Interface C-PHY Interface (MIPI C-PHY interface), and includes a 3-wires serial signal channel. In detail, when the test signals S0 are transmitted through the first signal transmission form, the test signals S0 can be divided into three C-PHY sub-signals S1, S2, S3, and that transmission is performed individually through one signal channel of the 3-wires serial signal channels.

Further, according to the present invention, the second transmission interface 38 relates to a high-speed logic interface, and includes a pair of high-speed logic signal channels, wherein each high-speed logic signal channel can be regarded as a differential logic signal channel. In detail, when the test signals S0 are converted, through the interface conversion circuit 36, from the first signal transmission form into the second signal transmission form, the C-PHY sub-signal S1 will be divided into a pair of differential sub-signals S11, S12, the C-PHY sub-signal S2 will be divided into a pair of differential sub-signals S21, S22, and that the C-PHY sub-signal S3 will be divided into a pair of differential sub-signals S31, S32, where each of them perform transmission through one of the high-speed logic signal channels. The second transmission interface 38 may relate, but not limited, to one of the following types: low voltage differential signaling (LVDS); current mode logic (CML); positive emitter coupled logic (PECL); and negative emitter coupled logic (NECL).

Still further, according to the present invention, the test assembly 3 relates to a probe card 32, where the probe card 32 includes a probe card sub-board 35, such that the interface conversion circuit 36 can be arranged on the probe card sub-board 35, but not so limited. Arranging the probe card sub-board 35 on the probe card sub-board 35 may have advantages, among them, the measure to arrange components on the test assembly 3 can be more flexible.

According to the present invention, a first signal transmission route L1 is located in between the test object 7 and the interface conversion circuit 36, wherein the first signal transmission route L1 is, but not limited to, less than 10 cm. In addition, a second signal transmission route L2 is located in between the interface conversion circuit 36 and the logic procession unit 44, wherein the second signal transmission route L2 is, but not limited to, less than 20 cm. As such, the loss during transmission of signals can be reduced.

Given the above, it is understood that after the test signals S0 have been converted through the interface conversion circuit 36, transmission can be performed through the measure of differential signals. Therefore, the image test system 1, according to the present invention, can be adapted for longer signal transmission routes. In other words, the image test system 1, according to the present invention, can be adapted for electric test of the C-PHY signals; or for various situations of substrate layout, so as to reduce the loss during transmission of signals.

Figure 3:
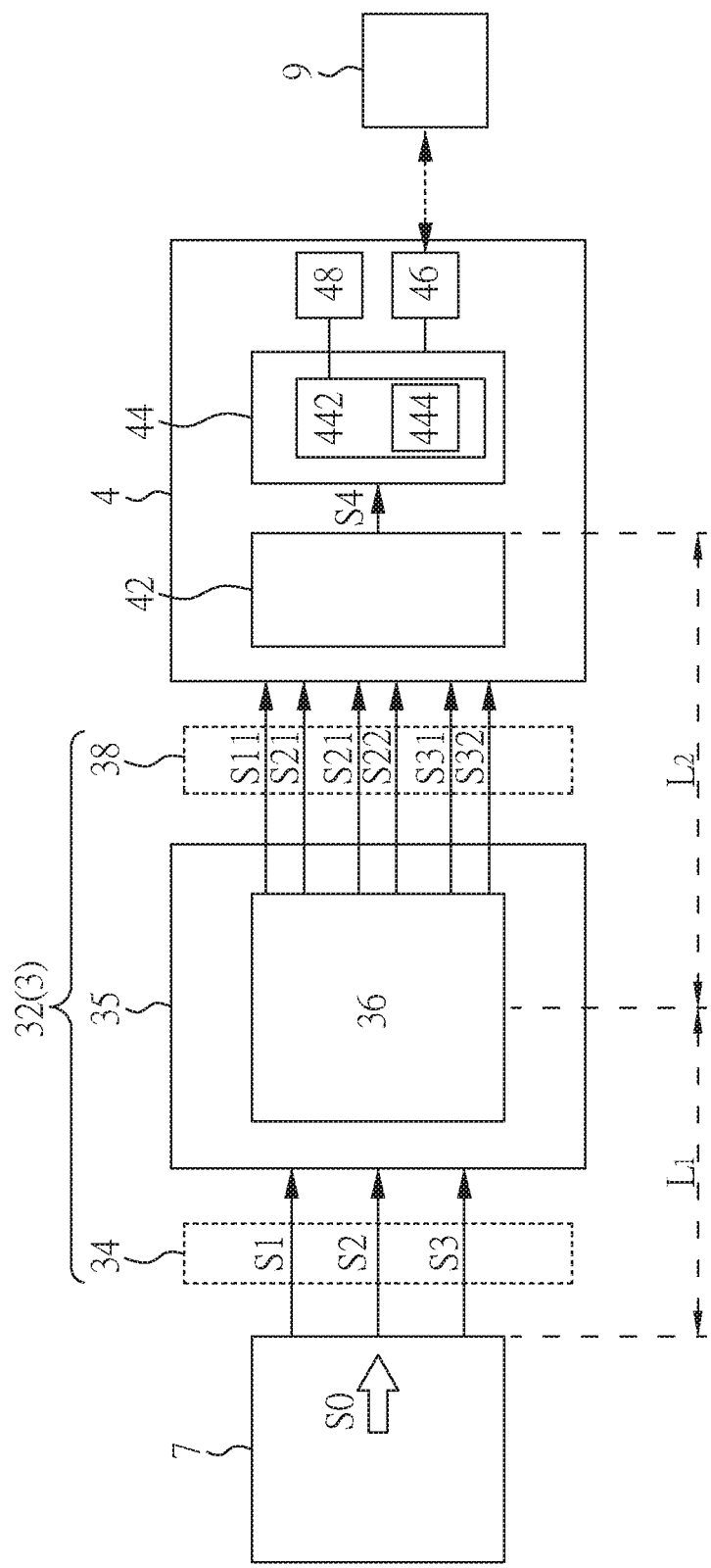
FIG. 3 is a schematic view illustrating in detail the framework of a test system and an image capture card according to a second embodiment of the present invention.

Further, according to the present invention, the image capture card 4 may be of different structures. Referring to FIG. 3, a schematic view illustrating in detail the framework of a test system and an image capture card according to a second embodiment of the present invention, the image capture card 4 includes a data conversion unit 42, a logic procession unit 44, a transmission unit 46, and a memory unit 48, wherein the logic procession unit 44 includes a clock data recovering (CDR) unit 442. Further, since the test assembly 3 in this embodiment, as described in FIG. 3, can be described with the description for FIG. 2, no redundancy is required.

According to the present invention, when the image capture card 4 acquires the test signals S0 (multiple pairs of high-speed logic signals S11 and S12, S21 and S22, and S31 and S32) from the second transmission interface 38, the data conversion unit 42 can integrate those signals and convert the same into a signal (hereinafter referred to as "second test signal S4") readable to the logic procession unit 44. The clock data recovering unit 442 of the logic procession unit 44 can perform a clock data recovering procedure to the second test signal S4, such that the lag behind or advance ahead (time sequence offset) occurred during the process of transmission for the second test signal S4 can be recovered. As such, the time sequence for the second test signal S4 and the system time sequence for the image test system 1 can be consistent with each other, but not so limited.

According to the present invention, the clock data recovering unit 442 can set a data collection point for the second test signal S4, such that the data collection point can be employed as a basis for time sequence correction. For example, the second test signal S4 can appear as a form of eye diagram, and that the clock data recovering unit 442 can, for example, make the center of the eye diagram as the data collection point; and make a comparison between the time sequence position of the data collection point and the correct time sequence position of the system time sequence, so as to determine whether or not the time sequence of the second test signal S4 offsets.

Further, according to the present invention, the clock data recovering unit 442 includes a fuzzy control unit 444; or alternatively, the clock data recovering unit 442, itself, is a fuzzy control unit 444. The fuzzy control unit 444 can perform a clock data recovering procedure based on an offset tendency of the second test signal S4 at a last time point, and on an offset tendency of the second test signal S4 at the present time point. According to the present invention, the memory unit 48 can store, beforehand, a fuzzy control look-up table 50, wherein the fuzzy control look-up table 50 includes multiple recovering measures in correspondence with offset tendencies. As such, in case the fuzzy control unit 444 acquires an offset tendency of the second test signal S4, a corresponding recovering measure can be produced based on the fuzzy control look-up table 50.

Now referring to FIG. 4, the fuzzy control look-up table 50 according to the present invention, and also to FIG. 1 to FIG. 3, the fuzzy control look-up table 50 includes multiple last time clock offset data 51, multiple present time clock offset data 52, and multiple recovering data 53, wherein each recovering data 53 corresponds to a last tin offset data 51 and to a present time clock offset data 52.

Still further, according to the present invention, for example, when the last time clock offset data 51 of the second test signal S4 is N2 (for example, the time sequence of the second test signal 54 lags behind the system clock for two time unit and when the present time clock offset data 52 of the second test signal S4 is P2 (for example, the time sequence of the second test signal S4 advances ahead the system sequence for two time unit), the recovering data 53 is Z (for example, not to perform recovery). At this moment, the fuzzy control unit 444 will not perform any adjustment on the second test signal S4. In addition, for example, when the last time clock offset data 51 of the second test signal S4 is N1 (for example, the time sequence of the second test signal 4 lags behind the system sequence for one time unit), and when the present time clock offset data 52 of the second test signal S4 is P2 (for example, the time sequence of the second test signal S4 advances ahead the system clock for two time unit), the recovering data 53 is P2 (for example, the time sequence of the second test signal S4 advances ahead two time unit). At this moment, the fuzzy control unit 444 will perform adjustment on the second test signal S4 based on the recovering data 53. As such, the clock data recovering unit 442 can accomplish the clock data recovering procedure.

According to the present invention, the clock data recovering unit 442 can, through the measure of machine learning, and by means of inputting a great amount of training data, so as to produce optimal measures for recovering various offset situations, hut not so limited. According to the present invention, the clock data recovering unit 442 may relate to various kinds of neural network-like models, such as convolutional neural networks, random forests, deep learning neural networks, and so forth, but not so limited.

Now referring to FIG. 3 again, in this embodiment, the data conversion unit 42, the logic procession unit 44, and the memory unit 48 can realize their functions by the forms of circuits, chips, and so forth. However, it should be noted that according to the present invention, it is not intended to limit the structure of circuits for the conversion unit 42, the logic procession unit 44, and the memory unit 48, so long as the functions, as described, can be realized, such that the scope of the present invention may cover. Further, according to the present invention, the logic procession unit 44 may, for example, relate to a field programmable gate array, a FPGA chip, a customized adjustment chip (such an application specific integrated circuit, ASIC chip), a graphics processing unit, GPU), and so forth, but not so limited. Still further, according to the present invention, the clock data recovering unit 442 and the fuzzy control unit 444 may relate to sub-circuits in chips; or may be realized by a measure of the products of computer program, but not so limited.

Figure 5:
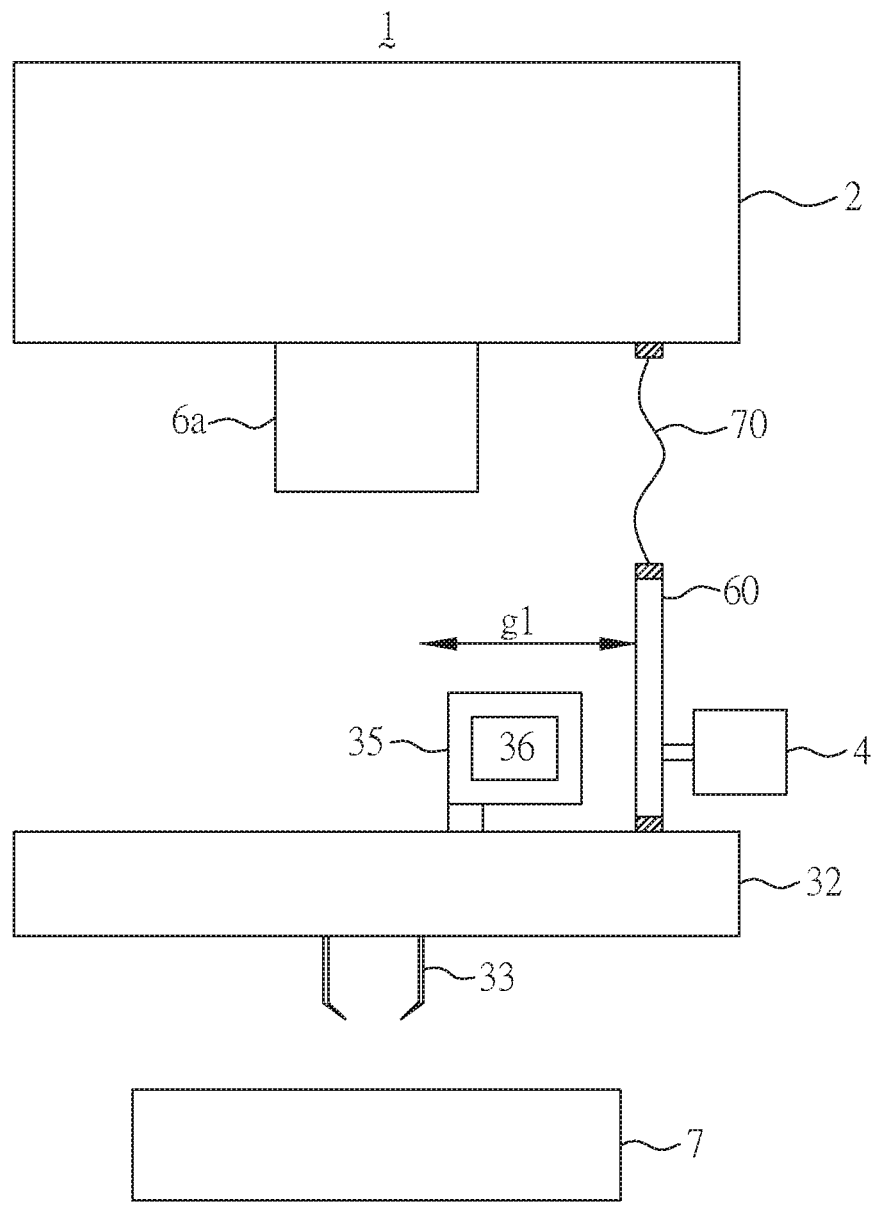
FIG. 5 is a schematic view illustrating a layout of the test assembly and the image capture card according to the first embodiment of the present invention.

According to the present invention, there are multiple measures to arrange in between the test assembly 3 and the image capture card 4, and that the following are the descriptions in this concern. References are made to FIG. 5, a schematic view illustrating a layout of the test assembly 3 and the image capture card 4 according to the first embodiment of the present invention; and FIG. 1 to FIG. 4. As shown in FIG. 5, the interface conversion circuit 36 is arranged on the probe card sub-board 35, whereas the probe card sub-hoard 35 is arranged on the probe card 32. In addition, the probe card 32 is arranged with the first bridge board 60, wherein the first bridge board 60 has its one end arranged on the probe card 32, and its other end connected with the test head 2 through a connecting line 70, so as to achieve the purpose of electric connection between the probe card 32 and the test head 2. The image capture card 4 may be arranged on the first bridge board 60. As such, when the probe 33 receives a signal from the test object 7 (such as the test signal S0), the signal can be transmitted, through the probe card 32, to the interface conversion circuit 36 for a conversion, and that the converted signal can be transmitted, through the probe card 32, to the image capture card 4 at the first bridge board 60.

Further, according to the present invention, the probe card sub-board 35 is detachably inserted on the probe card 32. As such, the probe card sub-board 35 is replaceable, for instance, as long as the probe card sub-board 35 is worn-out, it can be replaced easily. Still further, according to the present invention, the image capture card 4 can be detachably inserted on the first bridge board 60, and therefore, the image capture card 4 is also replaceable, but it is not intended to be so limited.

Figure 6:
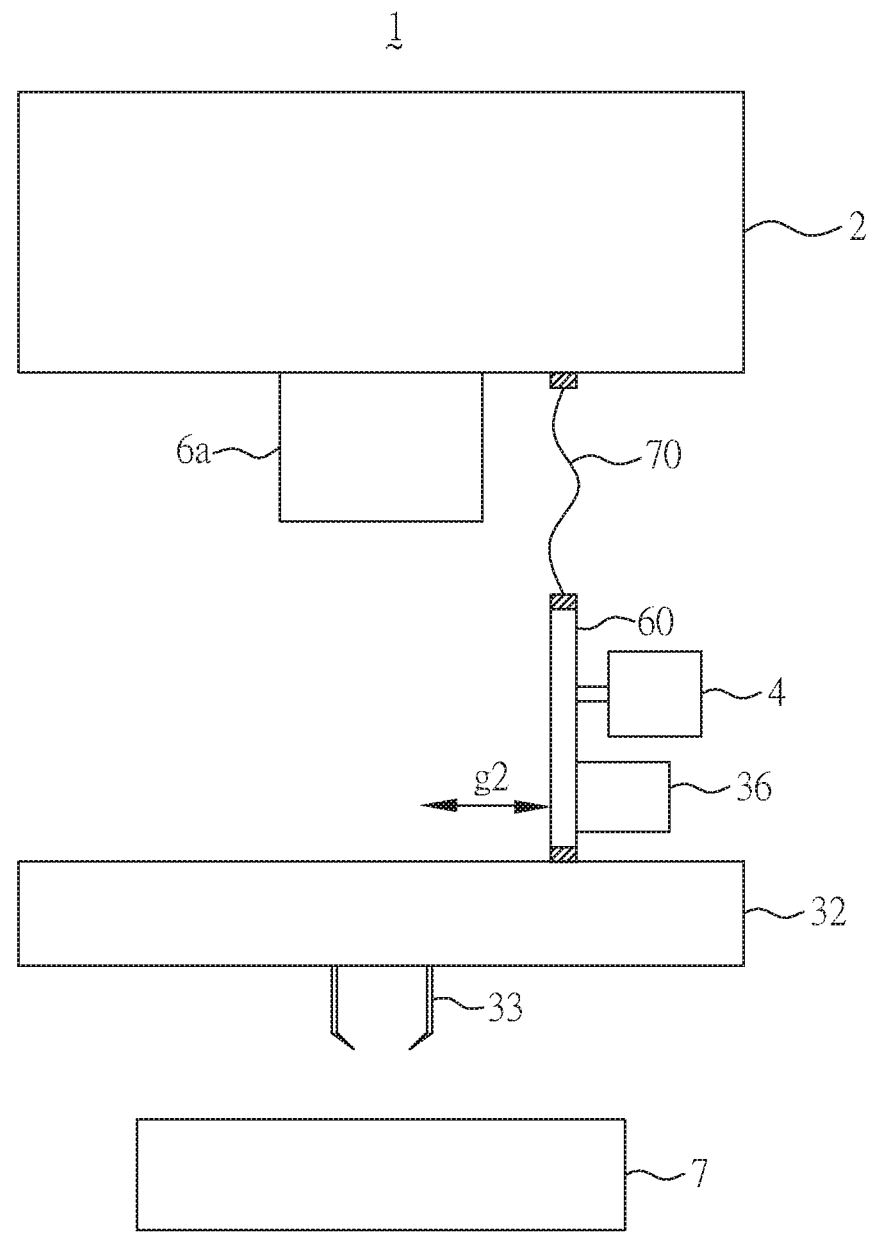
FIG. 6 is a schematic view illustrating a layout of the test assembly and the image capture card according to the second embodiment of the present invention.

Now references are made to FIG. 6, a schematic view illustrating a layout of the test assembly 3 and the image capture card 4 according to the second embodiment of the present invention; and also FIG. 1 to FIG. 5. As shown in FIG. 6, in the second embodiment, the interface conversion circuit 36 and the image capture card 4 are integrated, in the meantime, on the first bridge board 60, wherein the first bridge board 60 can be used as the probe card sub-board 35. The first bridge board 60 may have its one end arranged on the probe card 32, and its other end connected with the test head 2 through the connecting line 70. In the second embodiment, when the probe 33 receives a signal from the test object 7, the signal can be transmitted, through the probe card 32, to the interface conversion circuit 36 on the first bridge 60 so as to proceed with a conversion, than the converted signal can be transmitted, through the first bridge card 60 directly, to the image capture card 4.

According to the present invention, with references to FIG. 5 and FIG. 6, in view of the fact that the interface conversion circuit 36 and the image capture card 4 are integrated, in the meantime, on the first bridge board 60, the number of substrates can be reduced, and besides, the first bridge board 60 can be closer to the probe 33, such that the distance between the image capture card 4 and the probe 33 can be shorter, namely the signal transmission route can be much shorter. In detail, there is a route distance g1 between the probe 33 and the first bridge board 60, as shown in FIG. 5, and that a route distance g2 between the probe 33 and the first bridge board 60, as shown in FIG. 6, wherein the route distance g1 may be greater than the route distance g2. In the second embodiment, the route distance g2 may be smaller than, or equal to, 10 cm, but it is not intended to be so limited.

Figure 7:
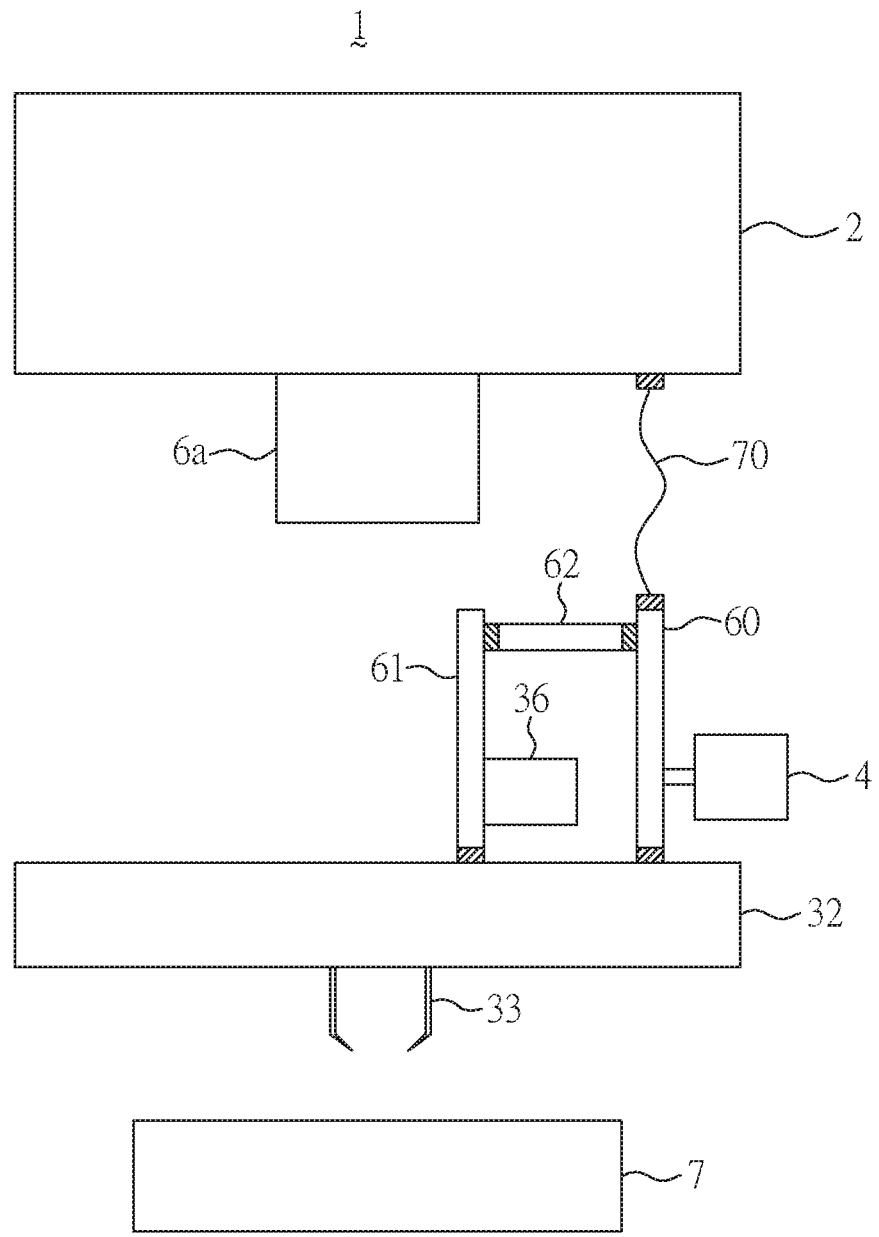
FIG. 7 is a schematic view illustrating the layout of a test assembly and an image capture card according to a third embodiment of the present invention.

Further, references are made to FIG. 7, a schematic view illustrating a layout of the test assembly 3 and an image capture card 4 according to a third embodiment of the present invention; and also FIG. 1 to FIG. 6. As shown in FIG. 7, in the third embodiment, the image capture card 4 is arranged on the first bridge board 60, and that the interface conversion circuit 36 is on a second bridge board 61, wherein the second bridge board 61 can be used as the probe card sub-board 35. The first bridge board 60 and the second bridge board 61 can be connected with each other through a third bridge board 62. As such, the first bridge board 60 and the second bridge board 61 can transmit signals through the third bridge board 62.

Still further, according to the present invention, the first bridge board 60 or the second bridge board 61 can be connected with the test head 2 through the connecting line 70, so as to achieve the purpose that the probe card 32 and the test head 2 can be electrically connected with each other. According to the present invention, the interface conversion circuit 36 may be welded to the second bridge board 61, or be detachably inserted on the second bridge board 61, though it is not intended to be so limited.

Figure 8:
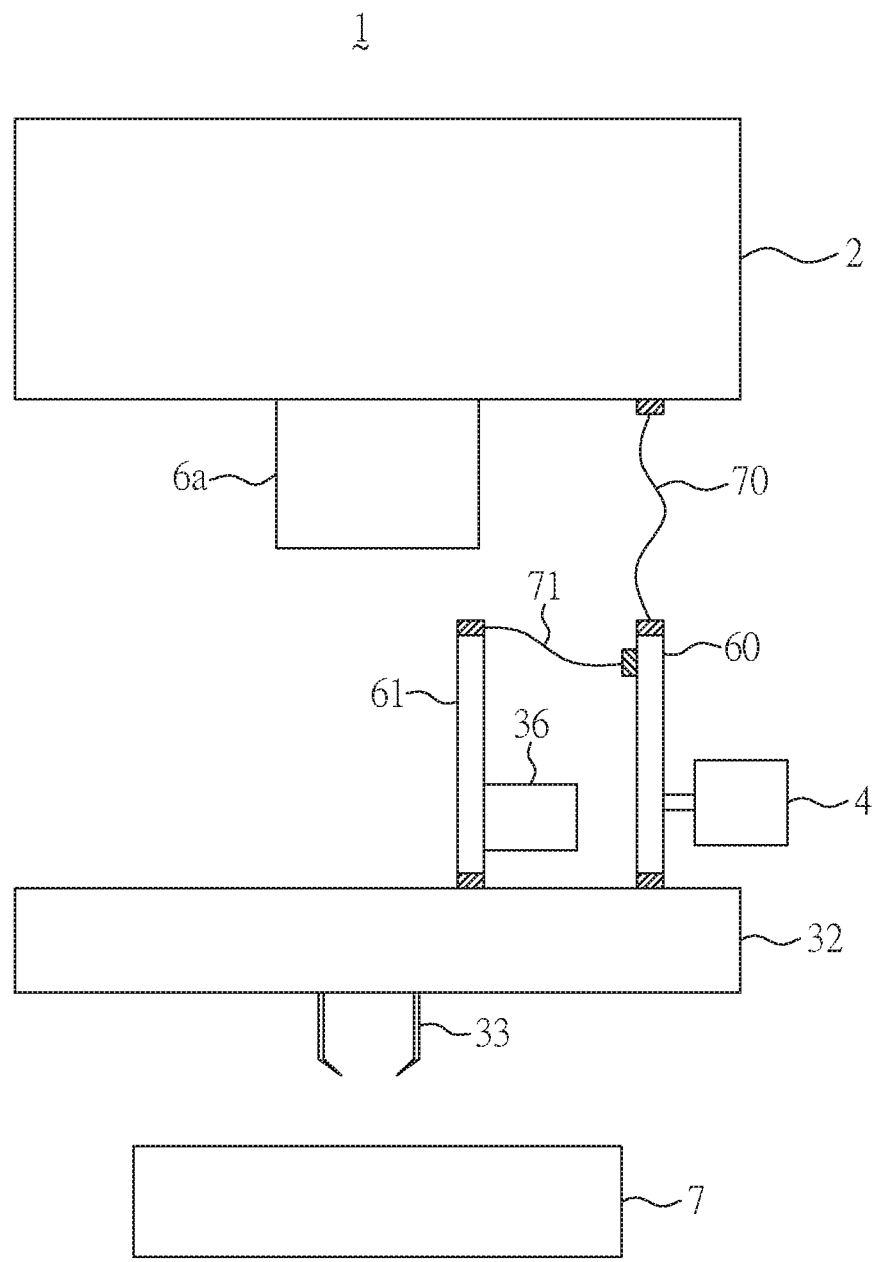
FIG. 8 is a schematic view illustrating the layout of a test assembly and an image capture card according to a fourth embodiment of the present invention.

Now references are made to FIG. 8, a schematic view illustrating a layout of the test assembly 3 and the image capture card 4 according to a fourth embodiment of the present invention, and to FIG. 1 to FIG. 7. As shown in FIG. 8, in the fourth embodiment, the image capture card 4 is arranged on the first bridge board 60, and that the interface conversion circuit 36 is on the second bridge board 61, wherein the second bridge board 61 can be used as the probe card sub-board 35. The first bridge board 60 and the second bridge board 61 can be connected with each other through a connecting line 71 for transmitting signals.

According to the present invention, the first bridge board 60 or the second bridge board 61 can be connected with the test head 2 through the connecting line 70, so as to achieve the purpose that the probe card 32 and the test head 2 can be electrically connected with each other. In addition, the interface conversion circuit 36 may be welded to the second bridge board 61, or be detachably inserted on the second bridge board 61, though it is not intended to be so limited.

It is understood that, according to the present invention, the measures of arrangement, given above, are only proposed for the purpose of exemplification, and that there are still more measures of arrangement available between the test assembly 3 and the image capture card 4.

Therefore, the present invention provides an improved image test system, and through arranging the interface conversion circuit, energy consumption for the C-PHY signals, as transmitted to the image capture card, can be reduced. In addition, by arranging a fuzzy controller in the image capture card, the time sequence offset of the C-PHY signals can be recovered so as to solve the problem of signal jitter, and to make a more accurate test for the C-PHY signals.

Although the present invention has been explained in relation to its preferred embodiments, it is to be understood that many other possible modifications and variations can be made without departing from the scope of the invention as hereinafter claimed.

What is claimed is:

1. An image test system, comprising:
a test assembly, for capturing test signals from a test object;
and the test assembly including:
a first transmission interface, for receiving the test signals;
an interface conversion circuit, for connecting with the first transmission interface, and for converting signal transmission forms of the test signals;
a second transmission interface, connected with the interface conversion circuit, wherein the first transmission interface and the second transmission interface correspond to different signal transmission forms; and
an image capture card, for connecting with the second transmission interface, and capturing image data from the test signals;
wherein the image capture card includes a logic processing unit, and the logic processing unit includes a fuzzy controller for performing a clock data recovering procedure to the image data.

2. The image test system as claimed in claim 1, wherein the first transmission interface relates to a Mobile Industry Processor Interface C-PHY Interface (MIPI C-PHY interface), and includes a 3-wires serial signal channel.

3. The image test system as claimed in claim 1, wherein the second transmission interface relates to a high-speed logic interface, and includes three pairs of high-speed logic signal channels.

4. The image test system as claimed in claim 3, wherein the second transmission interface includes one of the following types: low voltage differential signaling (LVDS); current mode logic (CML); positive emitter coupled logic (PECL);
and negative emitter coupled logic (NECL).

5. The image test system as claimed in claim 1, wherein the test assembly relates to a probe card, and includes a probe card sub-board, such that the interface conversion circuit is arranged on the probe card sub-board.

6. The image test system as claimed in claim 5, wherein the image capture card is integrated on the probe card sub-board.

7. The image test system as claimed in claim 6, wherein the probe card includes a plurality of probes, and a signal transmission route distance between the probes and the probe card sub-board is smaller than or equal to 10 cm.

8. The image test system as claimed in claim 1, wherein the logic processing unit includes a memory unit for storing a fuzzy control look-up table, such that the fuzzy controller can perform the clock data recovering procedure based on the fuzzy control look-up table.

9. The image test system as claimed in claim 8, wherein the fuzzy control look-up table includes multiple last time clock offset data, multiple present time clock offset data, and multiple recovering data; and wherein each recovering data corresponds to a last time clock offset data, and to a present time clock offset data.

10. A test assembly, arranged in an image test system, for capturing tested signals of a test object, and the test assembly comprising:
a first transmission interface, for receiving the test signals;
an interface conversion circuit, for connecting with the first transmission interface, and for converting signal transmission forms of the test signals; and
a second transmission interface, for connecting with the interface conversion circuit, wherein the first transmission interface and the second transmission interface correspond to different signal transmission forms;

wherein the image test system includes an image capture card for connecting with the second transmission interface, so as to obtain image data from the test signals; and wherein the image capture card includes a logic processing unit, and the logic processing unit includes a fuzzy controller for performing a clock data recovering procedure to the image data.

11. The test assembly as claimed in claim 10, wherein the first transmission interface relates to a Mobile Industry Processor Interface C-PHY Interface (MIPI C-PHY interface), and includes a 3-wires serial signal channel.

12. The test assembly as claimed in claim 10, wherein the second transmission interface relates to a high-speed logic interface, and includes three pairs of high-speed logic signal channels.

13. The test assembly as claimed in claim 12, wherein the second transmission interface includes one of the following types: low voltage differential signaling (LVDS); current mode logic (CML); positive emitter coupled logic (PECL); and negative emitter coupled logic (NECL).

14. The test assembly as claimed in claim 10, wherein the test assembly relates to a probe card, and includes a probe card sub-board, such that the interface conversion circuit is arranged on the probe card sub-board.

15. The test assembly as claimed in claim 14, wherein the image test system includes an image capture card for connecting with the second transmission interface, so as to obtain image data from the test signals; and wherein the image capture card is integrated on the probe card sub-board.

16. The test assembly as claimed in claim 15, wherein the probe card includes a plurality of probes, and a signal transmission route distance between the probe and the probe card sub-board is smaller than or equal to 10 cm.

17. The test assembly as claimed in claim 10, wherein the logic processing unit includes a memory unit for storing a fuzzy control look-up table, such that the fuzzy controller performs the clock data recovering procedure based on the fuzzy control look-up table.

18. The test assembly as claimed in claim 17, wherein the fuzzy control look-up table includes multiple last time clock offset data, multiple present time clock offset data, and multiple recovering data, and wherein each recovering data corresponds to a last time clock offset data, and to a present time clock offset data.

* * * * *